United States Patent
Hong et al.

(10) Patent No.: US 8,407,566 B2
(45) Date of Patent: Mar. 26, 2013

(54) METHOD AND APPARATUS FOR CHANNEL CODING AND MODULATION FOR UNEQUAL ERROR PROTECTION IN TRANSMITTING UNCOMPRESSED VIDEO OVER WIDEBAND HIGH FREQUENCY WIRELESS SYSTEM

(75) Inventors: Seung Eun Hong, Daejeon (KR); Kyeongpyo Kim, Daejeon (KR); Yong Sun Kim, Suwon-si (KR); Woo Yong Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 915 days.

(21) Appl. No.: 12/474,910

(22) Filed: May 29, 2009

(65) Prior Publication Data
US 2010/0223526 A1    Sep. 2, 2010

(30) Foreign Application Priority Data
Feb. 27, 2009    (KR) .................. 10-2009-0016817

(51) Int. Cl.
 *H03M 13/00* (2006.01)
(52) U.S. Cl. ........................................ 714/776
(58) Field of Classification Search .................. 714/776
See application file for complete search history.

(56) References Cited

U.S. PATENT DOCUMENTS

| | | | |
|---|---|---|---|
| 2007/0198887 A1 | 8/2007 | Reznic et al. | |
| 2008/0253462 A1* | 10/2008 | Singh et al. | 375/240.25 |
| 2009/0220034 A1* | 9/2009 | Ramprashad et al. | 375/341 |
| 2012/0207223 A1* | 8/2012 | Xia et al. | 375/240.24 |

FOREIGN PATENT DOCUMENTS

| | | |
|---|---|---|
| JP | 2001-136154 | 5/2001 |
| KR | 10-2007-0117425 | 12/2007 |
| KR | 10-2008-0007055 | 1/2008 |

* cited by examiner

*Primary Examiner* — Albert Decady
*Assistant Examiner* — Enam Ahmed
(74) *Attorney, Agent, or Firm* — Staas & Halsey LLP

(57) ABSTRACT

An Unequal Error Protection (UEP) transmission apparatus comprises a bit separator unit configured to, when video data are received, separate pixels of the video data into Most Significant Bits (MSBs) and Least Significant Bits (LSBs) according to a degree of importance on a pixel-component basis; a header generation unit configured to create an MSB sub-frame and a LSB sub-frame based on the respective MSBs and LSBs and create an MSB Medium Access Control (MAC) sub-frame and a LSB MAC sub-frame to which respective headers are added; and a channel coding unit configured to create a channel-encoded MSB data and a channel-encoded LSB data by performing error correction encodings corresponding to the respective MSB MAC sub-frame and LSB MAC sub-frame and add padding bits, corresponding to the respective channel-encoded MSB data and channel-encoded LSB data, to the channel-encoded MSB data and channel-encoded LSB data.

15 Claims, 4 Drawing Sheets

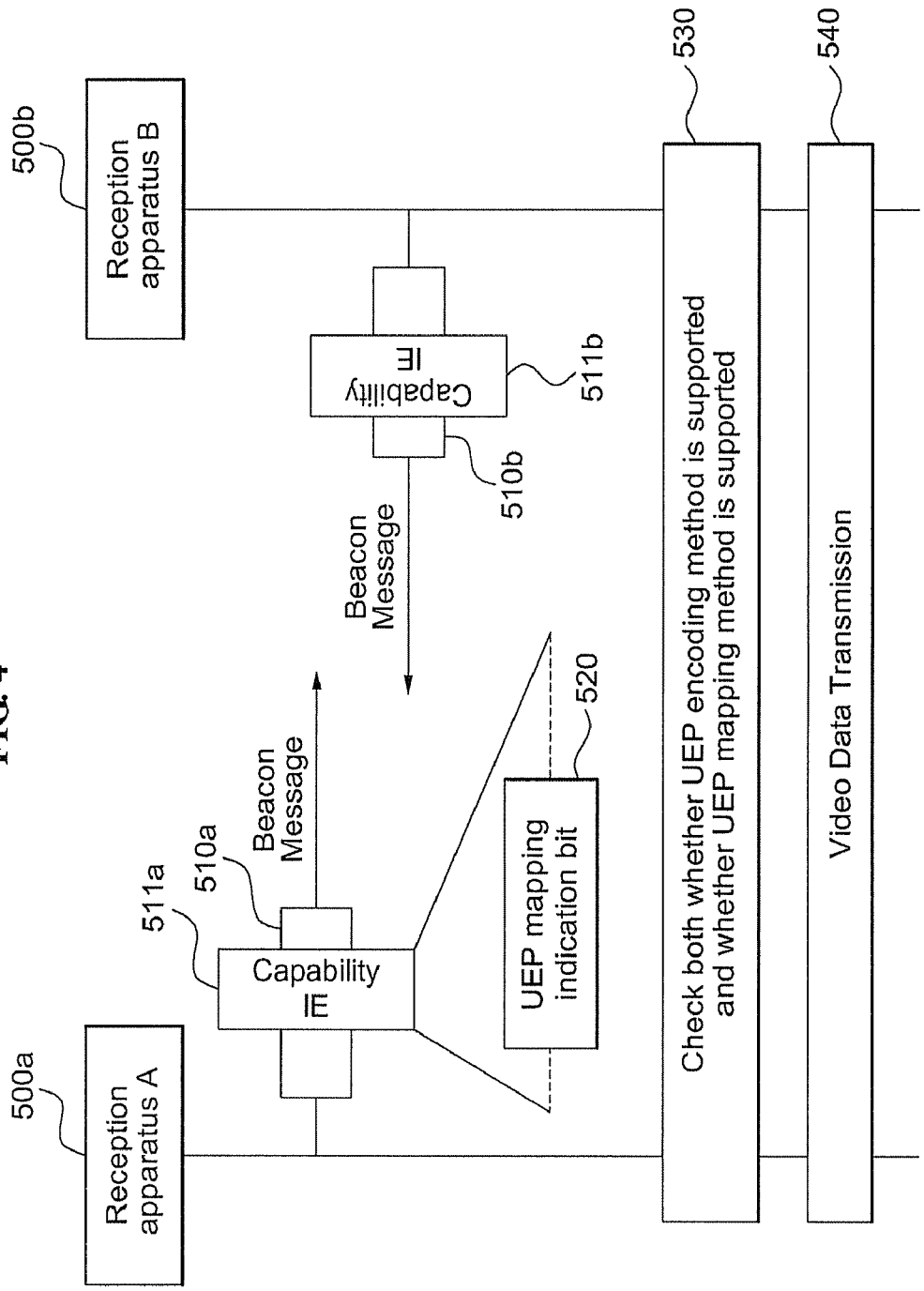

METHOD AND APPARATUS FOR CHANNEL CODING AND MODULATION FOR UNEQUAL ERROR PROTECTION IN TRANSMITTING UNCOMPRESSED VIDEO OVER WIDEBAND HIGH FREQUENCY WIRELESS SYSTEM

CROSS-REFERENCE TO RELATED APPLICATION

This application claims the benefit of Korean Patent Application No. 10-2009-0016817, filed on Feb. 27, 2009, the entire disclosure of which is incorporated herein by reference.

BACKGROUND

1. Field of the Invention

The present invention relates to an unequal error encoding and modulation scheme and apparatus for transmitting uncompressed video signals in a wide-band and high-frequency wireless system. More particularly, the present invention relates to an unequal error encoding and modulation scheme and apparatus for transmitting uncompressed video signals in a wide-band and high-frequency wireless system, which is capable of maintaining a possible high-speed transmission/reception rate and also transmitting and receiving a variety of uncompressed video signals robust against radio channel bit errors.

2. Description of the Related Art

The degree of importance of video information bits in video information differs unlike typical data information in which all information bits have the same degree of importance. For example, high-order bits of pixel bytes displaying video are more important than low-order bits thereof, and luminance information bits of video are more important than chrominance information bits thereof. Furthermore, in an RGB color system consisting of a red component, a green component, and a blue component, the green component is more important than the red and blue components.

In general, the amount of video information is much greater than that of typical data information. Furthermore, video information must be transmitted at high speed because of a real-time property requirement in information transmission. Also, a radio channel is likely to experience bit errors resulting from various factors, thereby leading to deformation in transmitted information. In order to minimize such information deformation resulting from the bit errors of the radio channel, a transmission terminal may add supplementary information (hereinafter referred to as a 'channel error correction symbol') to information to be transmitted, and a reception terminal may recover pieces of deformed information using the channel error correction symbol. However, the channel error correction symbol information is disadvantageous in that it lowers the transmission rate of a channel.

With the importance of video information and a radio channel property taken into consideration, recently developed high-speed transmission wireless systems using an ultra wide-band and high-frequency band are adopting a scheme for distinguishing high-order bits and low-order bits of pixel information bytes constituting video information and adding more channel error correction symbol information to the high-order bits and less channel error correction symbol information to the low-order bits in order to prevent further deformation of important information and improve picture quality. A method of using an unequal error correction scheme according to the importance of signals as described above is called an Unequal Error Protection (hereinafter referred to as a 'UEP') scheme.

In a conventional UEP scheme, however, whether bits are important bits is determined based on fixed bit positions. Accordingly, this scheme may not be used when the positions of important bits are dynamically changed.

SUMMARY OF THE INVENTION

An aspect of the present invention provides an unequal error encoding and modulation scheme and apparatus for transmitting uncompressed video signals in a wide-band and high-frequency wireless system.

Another aspect of the present invention provides an unequal error encoding and modulation scheme and apparatus for transmitting uncompressed video signals in a wide-band and high-frequency wireless system, wherein a Most Significant Bit (MSB) data stream and a Least Significant Bit (LSB) data stream may be constructed more efficiently and conveniently based on uncompressed video information, and a more robust channel error correction symbol may added to the MSB data stream, thereby making video signals, as seen by a human, appear to have no error in color even though the video signals have the same bit error rate.

According to an aspect of the present invention, there is provided a Unequal Error Protection (UEP) transmission apparatus, including a channel coding unit configured to create a channel-encoded Most Significant Bit (MSB) data and a channel-encoded Least Significant Bit (LSB) data by performing error correction encodings respectively corresponding to an MSB Medium Access Control (MAC) sub-frame and an LSB MAC sub-frame, the MSB MAC sub-frame and the LSB MAC sub-frame being separately created based on a degree of importance on a pixel-component basis of video data; and a symbol mapping and modulation unit configured to perform modulations by mapping the channel-encoded MSB data and the channel-encoded LSB data to a predetermined number of symbols based on the degree of importance.

According to another aspect of the present invention, there is provided a UEP transmission method, including creating a channel-encoded MSB data and a channel-encoded LSB data by performing error correction encodings respectively corresponding to a MSB MAC sub-frame and an LSB MAC sub-frame, the MSB MAC sub-frame and the LSB MAC sub-frame being separately created based on a degree of importance on a pixel-component basis of video data; and modulating the channel-encoded MSB data and the channel-encoded LSB data by mapping the channel-encoded MSB data and the channel-encoded LSB data to a predetermined number of symbols based on the degree of importance.

Additional aspects, features, and/or advantages of the invention will be set forth in part in the description which follows and, in part, will be apparent from the description, or may be learned by practice of the invention.

BRIEF DESCRIPTION OF THE DRAWINGS

These and/or other aspects, features, and advantages of the invention will become apparent and more readily appreciated from the following description of exemplary embodiments, taken in conjunction with the accompanying drawings of which:

FIG. 4 is a diagram showing a process of transmitting UEP video data in the wide-band and high-frequency wireless system according to an embodiment of the present invention.

DETAILED DESCRIPTION OF THE PREFERRED EMBODIMENT

Figure 1:
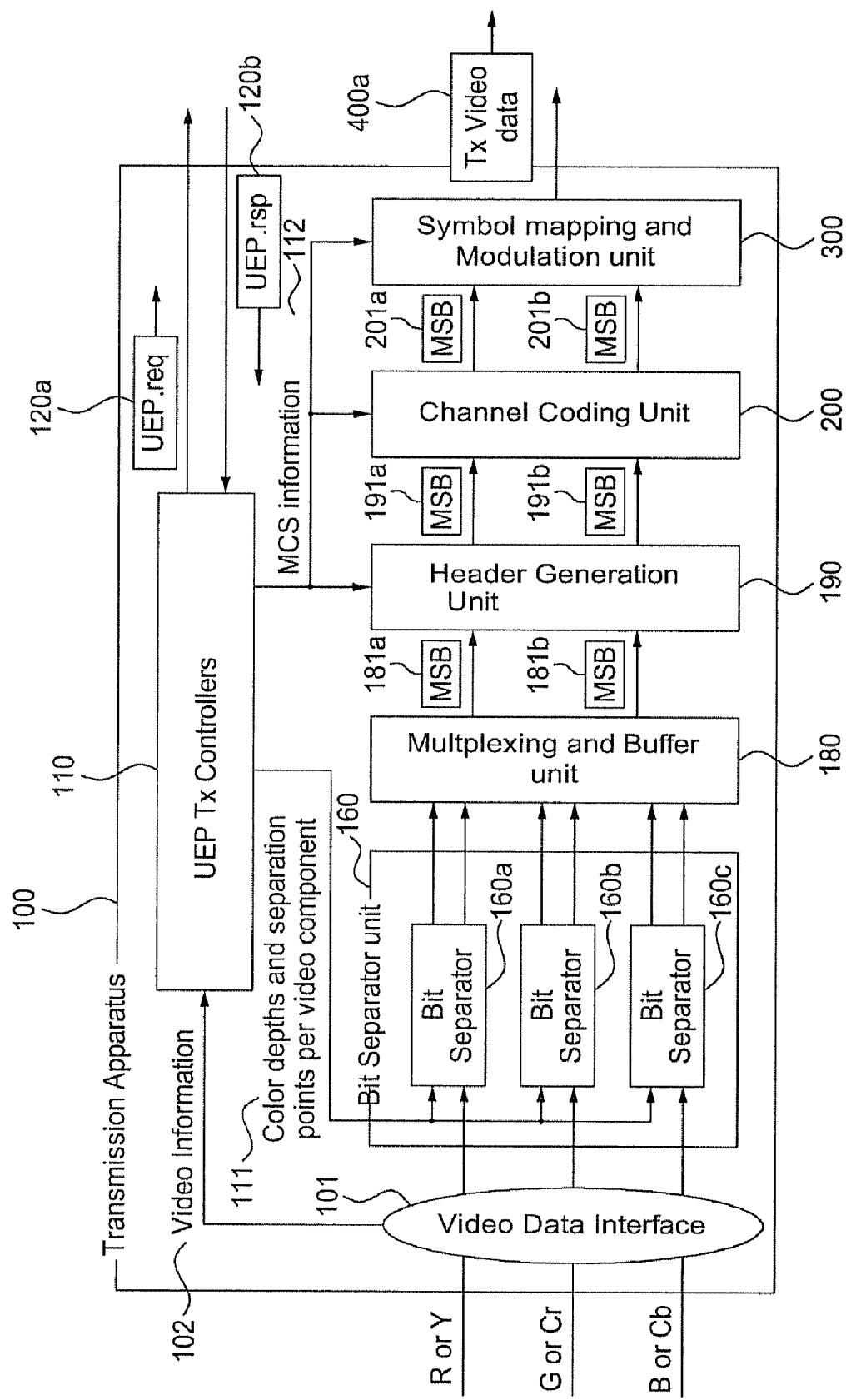
FIG. 1 is a diagram showing the configuration of a UEP transmission apparatus according to an embodiment of the present invention.

Reference will now be made in detail to exemplary embodiments of the present invention, examples of which are illustrated in the accompanying drawings, wherein like reference numerals refer to the like elements throughout. Exemplary embodiments are described below to explain the present invention by referring to the figures.

An embodiment of the present invention relates to an unequal error encoding and modulation scheme for transmitting uncompressed video signals in a wide-band and high-frequency wireless system. The configuration of a UEP transmission apparatus is described below with reference to FIG. 1.

Prior to a description of the present invention, in general, an MSB refers to a bit having the greatest effect on the operation of a bit unit, and a LSB refers to a bit having the smallest effect on the operation of a bit unit. In the embodiment of the present invention, however, when the pixels of video are divided into bits having a high degree of importance and bits having a low degree of importance in a broader sense, high-order bits having a high degree of importance are represented by the MSBs and low-order bits having a low degree of importance are represented by the LSBs.

FIG. 1 is a diagram showing the configuration of a UEP transmission apparatus according to the embodiment of the present invention.

The UEP transmission apparatus 100 includes a video data interface 101 configured to receive a variety of video signals, such as R/G/B or Y/Cb/Cr, and a UEP transmission (Tx) controller 110 configured to negotiate a UEP method with a reception apparatus and control an internal operation of the UEP transmission apparatus. The UEP transmission apparatus 100 further includes a bit separator unit 160 configured to separate the input video signals according to pixel bit space depths and separated bit positions given on a pixel-information basis and constitute a frame having a high degree of importance and a frame having a low degree of importance based on the separated video signals. The bit separator unit 160 includes a number of bit separators 160a, 160b, and 160c. The UEP transmission apparatus 100 further includes a multiplexing and buffer unit 180 configured to multiplex and store the constituted frames and a header generation unit 190 configured to determine sequences and priorities and write demodulation and channel decoding information. The UEP transmission apparatus 100 further includes a channel coding unit 200 configured to unequally add channel error correction information according to priorities and a symbol mapping and modulation unit 300 configured to perform symbol mapping and modulation according to priorities.

The video data interface 101 is configured to receive various forms of uncompressed video signals. In the embodiment of the present invention, only R/G/B and Y/Cb/Cr forms are taken into consideration, but other uncompressed video signals may also be received.

An R/G/B color image comprises pixels consisting of red (R), green (G), and blue (B) components. A Y/Cb/Cr color image comprises pixels consisting of a luminance (Y) component and two color difference components Cb and Cr.

The above-described pixel components can be represented by a variety of bit space depths, such as 8 bits or 16 bits. The video data interface 101 first notifies the UEP Tx controller 110 of the received uncompressed video information 102 and then performs a function of transferring the received uncompressed video information to the bit separator unit 160 on a pixel-information basis.

The UEP Tx controller 110 transmits information about whether a UEP encoding method is supported and whether a UEP mapping method is supported through a beacon. Furthermore, the UEP Tx controller 110 checks whether the UEP encoding method is supported and whether the UEP mapping method is supported through a beacon received from the reception apparatus. Checking both whether the UEP encoding method is supported and whether the UEP mapping method is supported through the beacon in the UEP Tx controller 110 is described later with reference to FIG. 4.

The UEP Tx controller 110 receives the video information 102, including the form of each of pixels constituting the video, the bit space depth of each pixel, and a separated bit position indicating the importance of each pixel, from the video data interface 101. Furthermore, in order to transmit the corresponding video using a UEP method, the UEP transmission apparatus 100 sends a UEP method negotiation request message 120a to the reception apparatus. In response to the UEP method negotiation request message, the reception apparatus sends a response message 120b to the UEP transmission apparatus 100.

The UEP Tx controller 110 determines pieces of UEP information 111 and 112 negotiated through the exchange of the messages 120a and 120b. Then, the UEP Tx controller 110 controls a series of procedures pertinent to the transmission of the video based on the pieces of negotiated UEP information 111 and 112. The bit separator unit 160 receives a series of video data having a bit form on a pixel-information (R/GB or Y/Cb/Cr) basis from the video data interface 101.

The bit separator unit 160 receives a bit space depth for each pixel information and bit separation position information for UEP from the UEP Tx controller 110. The bit separator unit 160 performs a function of constituting a frame having a high degree of importance and a frame having a low degree of importance based on the video data bits received on a pixel-information basis using a method described later with reference to FIG. 6.

The multiplexing and buffer unit 180 receives an MSB bit stream with a high degree of importance and a LSB bit stream with a low degree of importance, output on a pixel-information basis, from the bit separator unit 160. The multiplexing and buffer unit 180 can store the bit streams without changes from a form output from the bit separator unit 160 on the basis of two kinds of streams according to the degree of importance for every piece of pixel information. Furthermore, the multiplexing and buffer unit 180 can sequentially multiplex the MSB bit stream and the LSB bit stream for every piece of pixel information basis and store the multiplexing results in the form of an MSB bit stream and a LSB bit stream irrespective of the pixel information.

The header generation unit 190 reads MSBs 181a each having a predetermined length from the multiplexing and buffer unit 180 and constitutes an MSB sub-frame based on the read MSBs. Furthermore, the header generation unit 190 reads LSBs 181b each having a predetermined length from the multiplexing and buffer unit 180 and constitutes a LSB sub-frame based on the read LSBs.

Next, the header generation unit 190 constitutes an MSB MAC sub-frame 191a and a LSB MAC sub-frame 191b by adding header information to each of the MSB sub-frame and the LSB sub-frame and sends the MSB MAC sub-frame 191a and the LSB MAC sub-frame 191b to the channel coding unit 200. The added header information is described later with reference to FIG. 2.

The header generation unit 190 may control the length of each of the MSB MAC sub-frame 191a and the LSB MAC sub-frame 191b. The channel coding unit 200 may add the different numbers of error correction symbol bits to the MSB data stream and the LSB data stream. Accordingly, the header generation unit 190 may control the length of each of the MSB MAC sub-frame 191a and the LSB MAC sub-frame 191b such that the number of MSB data bits and the number of LSB data bits to be output from the channel coding unit 200 are the same.

Alternatively, the header generation unit 190 may write the number of bits to be padded to each of the MSB data and the LSB data in the header information. To this end, the header generation unit 190 receives Modulation and Coding Scheme (MCS) information 112 from the UEP Tx controller 110. The MCS information 112 includes modulation information and channel encoding information to be used for a processing of transmitting transmission frames. Furthermore, the header generation unit 190 can provide the reception apparatus with demodulation information and channel decoding information necessary for a processing of receiving transmission frames by adding the pieces of information to the header information.

The channel coding unit 200 unequally inserts channel error correction information into the frame data, received from the header generation unit 190, according to the priorities of the frame data based on the channel encoding information included in the MCS information 112 received from the UEP Tx controller 110. Specifically, the channel coding unit 200 creates a channel-encoded MSB data 201a by inserting more channel error correction information into the information data of the MSB MAC PDU 191a with a high priority. Furthermore, the channel coding unit 200 creates a channel-encoded LSB data 201b by inserting relatively less channel error correction information into the information data of the LSB MAC PDU 191b with a low priority or the channel-encoded LSB data 201b into which channel error correction information has not been inserted.

The channel coding unit 200 may add the same number of padding bits as the number designated by the header generation unit 190 when creating the channel-encoded MSB data 201a and the channel-encoded LSB data 201b.

The symbol mapping and modulation unit 300 maps the bits of the frames, received from the channel coding unit 200, to respective symbols. The symbol mapping and modulation unit 300 then modulates the mapped bits using a frame priority-based modulation method included in the MCS information 112 received from the UEP Tx controller 110 and sends the modulation results to the reception apparatus.

The channel coding unit 200 and the symbol mapping and modulation unit 300 are described in detail later with reference to FIG. 3.

Figure 2:
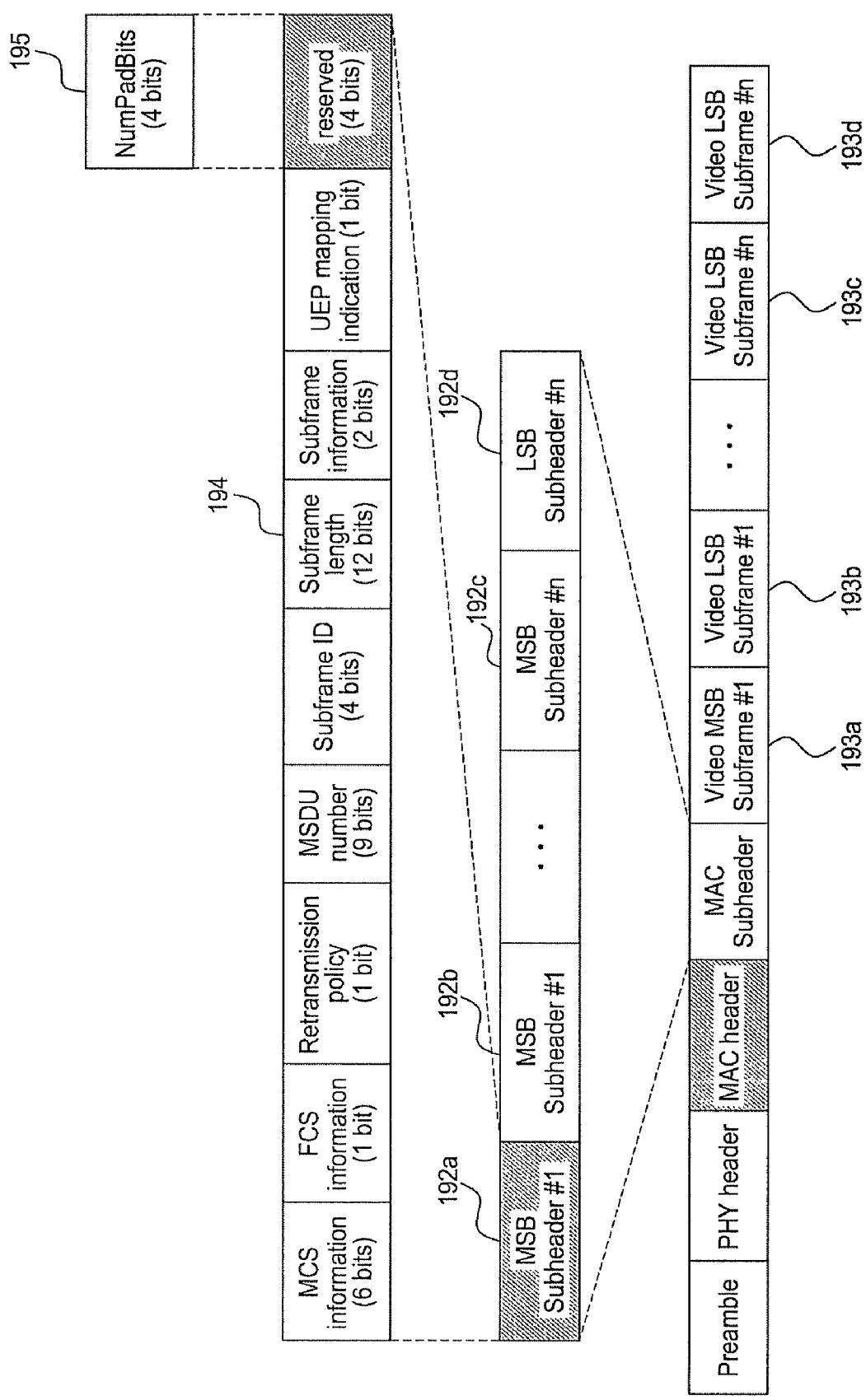
FIG. 2 is a diagram showing a MAC header format and a MAC PDU format used in the transmission/reception apparatuses of a wide-band and high-frequency wireless system according to an embodiment of the present invention.

FIG. 2 is a diagram showing a MAC header format and a MAC PDU format used in the transmission/reception apparatuses of a wide-band and high-frequency wireless system according to an embodiment of the present invention.

Sub-frame headers 192a, 192b, . . . , 192c, 192d of each video include respective pieces of information about video sub-frames 193a, 193b, . . . , 193c, 193d corresponding to the respective sub-frame headers 192a, 192b, . . . , 192c, 192d. Here, video sub-frames included in the same MAC PDU comprise a pair of an MSB sub-frame and a LSB sub-frame. Furthermore, a reserved 4-bit field from among the pieces of sub-frame header information may be defined with a padding bit number field 195 indicating the number of bits to be padded in the channel coding unit 200. Here, the padding bit number field 195 indicates the number of padding bits ranging from 0 to 15.

The channel coding unit 200 performs coding so that the following conditions are fulfilled using the padding bit number field 195 and a sub-frame length field 194, indicating a sub-frame byte length, from among the pieces of sub-frame header (192a, 192b, . . . , 192c, 192d) information.

A first condition is "$R_{MSB} \leq R_{LSB} \leq 1$." Here, it is assumed that the channel encoding rate of an MSB sub-frame consisting of high-order bits is $R_{MSB}$, and the channel encoding rate of a LSB sub-frame consisting of low-order bits is $R_{LSB}$.

A second condition is "$0 \leq P_{MSB} \leq P_{LSB} \leq 15$." Here, it is assumed that the number of padding bits of an MSB sub-frame consisting of high-order bits is $P_{MSB}$, and the number of padding bits of a LSB sub-frame consisting of low-order bits is $P_{LSB}$.

A third condition is the unit of $L_{MSB}$ and $L_{LSB}$ (bytes). Here, it is assumed that the length of an MSB sub-frame consisting of high-order bits is $L_{MSB}$, and the length of a LSB sub-frame consisting of low-order bits is $L_{LSB}$.

A fourth condition is that the magnitudes of $L_{MSB}$ and $L_{LSB}$ are determined so that, assuming that the number of high-order bits and low-order bit is (M:N-M) when the position of each bit is assigned to a constellation in order to prevent unequal bit error, the ratio of ($L_{MSB}/R_{MSB}$) and ($L_{LSB}/R_{LSB}$) is closest to (M:N-M). Here, N is a natural number enabling the size of a constellation to have a value of $2^N$, and M is a predetermined natural number smaller than N.

A fifth condition is that the values of $P_{MSB}$ and $P_{LSB}$ (i.e., the number of padding bits) are determined such that the ratio of "($L_{MSB}/R_{MSB}$)+$P_{MSB}$" and "($L_{LSB}/R_{LSB}$)+$P_{LSB}$" is exactly identical to the ratio of (M:N-M) based on the values of $L_{MSB}$ and $L_{LSB}$ approximately determined according to the above condition.

Figure 3:
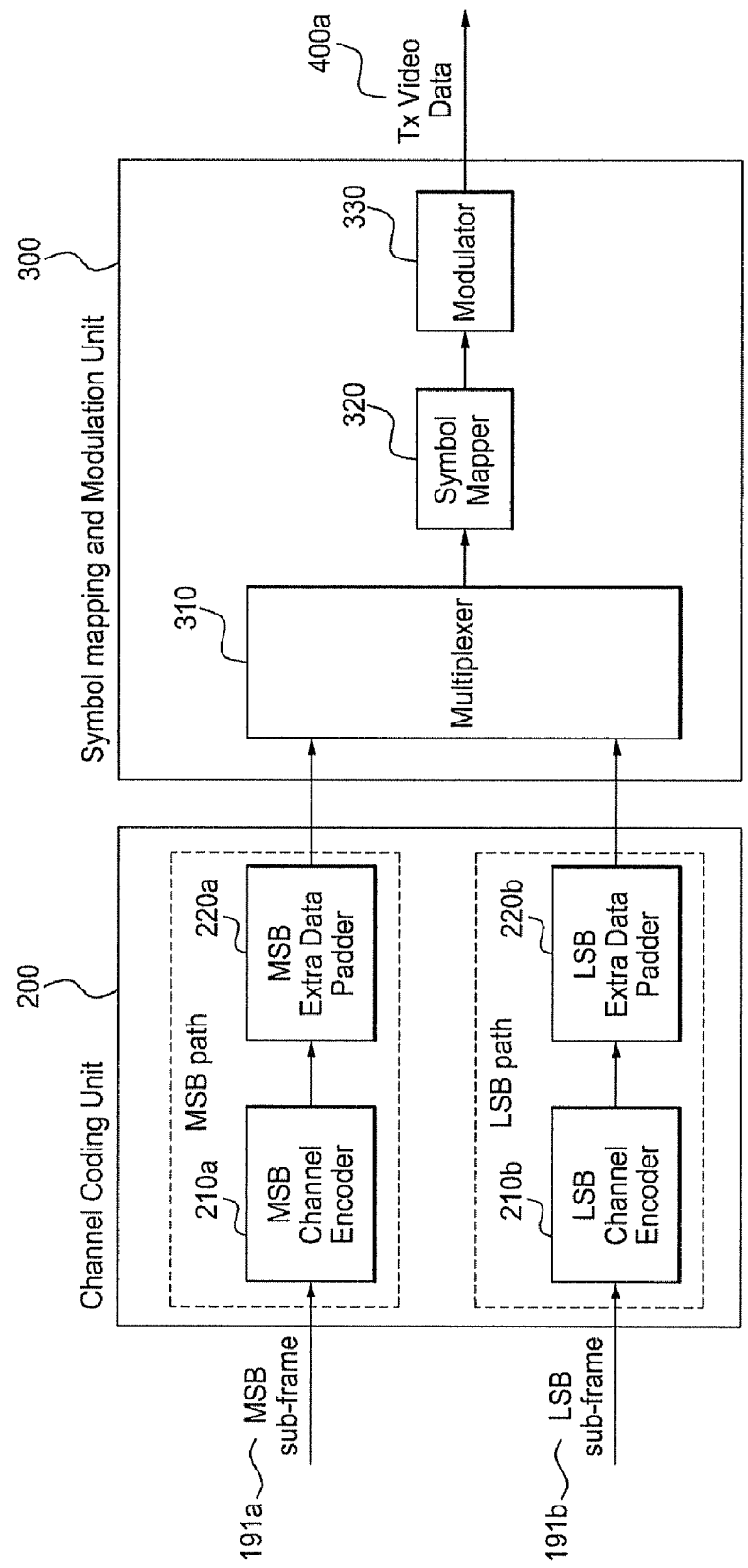
FIG. 3 is a diagram showing a detailed configuration of a channel coding unit and a symbol mapping and modulation unit in the UEP transmission apparatus according to an embodiment of the present invention.

FIG. 3 is a diagram showing a detailed configuration of the channel coding unit and the symbol mapping and modulation unit in the UEP transmission apparatus according to the embodiment of the present invention.

First, the MSB MAC sub-frame 191a and the LSB MAC sub-frame 191b are input in parallel to the channel coding unit 200, and the MSB and LSB MAC sub-frames 191a and 191b are input to respective independent MSB and LSB channel encoders 210a and 210b.

The channel encoders 210a and 210b may have the same kind of a channel encoding function, and may perform encodings using different parameters. The MSB channel encoder 210a receives the MSB MAC sub-frame 191a having a high degree of importance and performs channel encoding in such a way as to be more robust against channel error, thereby improving an error prevention effect. Also, the LSB channel encoder 210b receives the LSB MAC sub-frame 191b having a relatively low degree of importance and performs channel encoding in such a way as to be inferior against channel error as compared with the MSB MAC sub-frame 191a.

The channel-encoded MAC sub-frames, output from the MSB and LSB channel encoders 210a and 210b, are input to respective MSB and LSB extra data padders 220a and 220b each for adding the predetermined number of bit data to a corresponding channel-encoded MAC sub-frame in order to make the sizes of the channel-encoded MAC sub-frames the same.

The MSB and LSB extra data padders 220a and 220b add bit data having respective padding bit sizes, designated by the header generation unit 190, to the respective channel-encoded MAC sub-frames so that the sizes of the channel-encoded MSB and LSB MAC sub-frames have a predetermined ratio.

The multiplexer 310 receives the channel-encoded MSB MAC sub-frame to which the designated number of bit data has been added and the channel-encoded LSB MAC sub-frame to which the designated number of bit data has been added from the respective extra data padders 220a and 220b. Next, the multiplexer 310 performs a task of producing a series of bit streams by properly multiplexing the two MSB and LSB MAC sub-frames so that they have a size suitable for a constellation size to be used in a symbol mapper 320 and a modulator 330.

The multiplexer 310 receives information about a constellation size, used in the symbol mapper 320 and the modulator 330, from a Medium Access Control (MAC) layer (i.e., a high-order layer) in advance and performs adequate multiplexing based on the received information. For example, in the case where a constellation having $2^N$ points (where N is a predetermined natural number) is used, the multiplexer 310 fetches M bits (where M is a predetermined natural number smaller than N) from an MSB MAC sub-frame in advance. Next, the multiplexer 310 repeatedly performs a process of fetching the remaining number of (N-M) bits from a LSB MAC sub-frame, thereby producing a series of bit streams from the two frames.

The bit streams of the multiplexer 310 are input to the symbol mapper 320 configured to assign each bit to a distorted constellation. The distorted constellation has a structure capable of unequally assigning a Euclidean distance between high-order bits and a Euclidean distance between low-order bits. The symbol mapper 320 receives the output of the multiplexer 310 N bits by N bits and adequately assigns the received N bits to a constellation having 2N points. The symbol mapper 320 performs a function of making a Euclidean distance between high-order M bits greater than a Euclidean distance between low-order (N-M) bits. The symbols produced by the symbol mapper 320 are modulated and transmitted by the modulator 330. That is, the symbol mapper 320 performs symbol mapping for the MSB data in such a way as to have a relatively great Euclidean distance, and performs symbol mapping for the LSB data in such a way as to have a relatively small Euclidean distance. An unequal error encoding and modulation scheme for transmitting uncompressed video signals in the wide-band and high-frequency wireless system according to the embodiment of the present invention is described below with reference to FIG. 4.

FIG. 4 is a diagram showing a process of transmitting UEP video data in the wide-band and high-frequency wireless system according to an embodiment of the present invention. Referring to FIG. 4, the transmission/reception apparatuses 500a and 500b of the wide-band and high-frequency wireless system check a UEP capability through respective beacon messages 510a and 510b prior to the transmission of UEP video data.

The beacon messages 510a and 510b are always periodically transmitted before all the transmission/reception apparatuses 500a and 500b constituting an IEEE 802.15.3 WPAN system perform data communication. Furthermore, the beacon messages 510a and 510b may include respective pieces of UEP capability information 511a and 511b of the transmission/reception apparatuses 500a and 500b.

In the embodiment of the present invention, each of the pieces of UEP capability information 511a and 511b includes a UEP mapping indication bit 520. Accordingly, each of the transmission/reception apparatuses 500a and 500b can check both whether a UEP encoding method is supported and whether a UEP mapping method is supported based on the UEP mapping indication bit 520 at step 530.

Next, the transmission/reception apparatuses 500a and 500b transmit/receive video data, created through encoding and modulation at step 540, based on the information checked at step 530.

The method according to the above-described example embodiments may be recorded in computer-readable media including program instructions to implement various operations embodied by a computer. The media may also include, alone or in combination with the program instructions, data files, data structures, and the like. Examples of computer-readable media include magnetic media such as hard disks, floppy disks, and magnetic tape; optical media such as CD ROM disks and DVDs; magneto-optical media such as optical disks; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter.

As described above, the embodiments of the present invention relate to the unequal error encoding and modulation scheme and apparatus for transmitting uncompressed video signals in the wide-band and high-frequency wireless system configured to perform unequal bit error encoding in such a way as to be inclined toward high-order bits of a pixel (i.e., important bits) and perform assignment and modulation for high-order bits and low-order bits according to different constellations based on the fact that the difference in the color appearing resulting from errors of the high-order bits is greater than the difference in the color appearing resulting from errors of the low-order bits. Accordingly, more important pixel information can be protected more strongly, and so a severe degradation in the picture quality on the reception side resulting from transmission channel errors can be prevented. Conversely, an overall transmission rate can be improved because error control is concentrated on more important signal components.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. An Unequal Error Protection (UEP) transmission apparatus, comprising:
a channel coding unit configured to create channel-encoded Most Significant Bit (MSB) data and channel-encoded Least Significant Bit (LSB) data by performing error correction encodings respectively corresponding to an MSB Medium Access Control (MAC) sub-frame and an LSB MAC sub-frame, the MSB MAC sub-frame and the LSB MAC sub-frame being separately created based on a degree of importance on a pixel-component basis of video data; and
a symbol mapping and modulation unit configured to perform modulations by mapping the channel-encoded MSB data and the channel-encoded LSB data to a predetermined number of symbols based on the degree of importance,
wherein the symbol mapping and modulation unit is configured to enable the channel-encoded MSB data to have a greater Euclidean distance than the channel-encoded LSB data.

2. The UEP transmission apparatus according to claim 1, wherein the channel coding unit is further configured to perform the error correction encodings to enable the MSB MAC sub-frame to be stronger, against an error, than the LSB MAC sub-frame.

3. The UEP transmission apparatus according to claim 1, wherein the channel coding unit is further configured to add padding bits, corresponding to the respective channel-encoded MSB data and channel-encoded LSB data, to the channel-encoded MSB data and channel-encoded LSB data.

4. The UEP transmission apparatus according to claim 1, wherein the symbol mapping and modulation unit comprises:
a multiplexer configured to perform multiplexing of the channel-encoded MSB data and the channel-encoded LSB data to output bit streams;
a symbol mapping unit configured to perform symbol mappings for bit streams with a distorted constellation; and
a modulation unit configured to modulate the mapped symbols to generate UEP video data.

5. The UEP transmission apparatus according to claim 4, wherein the UEP video data comprises information about a priority indicating a degree of importance of the UEP video data, a sequence number indicating a transmission sequence, a Modulation and Coding Scheme (MCS) index indicating a method of modulating and channel-encoding the video data, the pixel component, and the bit space depth.

6. The UEP transmission apparatus according to claim 1, further comprising:
an UEP transmission controller configured to check, when the video data are received, a bit space depth and a bit separation position indicating a degree of importance for each of the pixel components constituting a pixel and control error correction encoding that corrects relatively more errors, to be used for information having a high degree of importance on a pixel-component basis;
a bit separator unit configured to separate pixels of the video data into MSBs having a high degree of importance and LSBs having a low degree of importance based on the control of the UEP transmission controller according to the degree of importance on the pixel-component basis; and
a header generation unit configured to create the MSB sub-frame and the LSB sub-frame based on the respective MSBs and LSBs and create the MSB MAC sub-frame and the LSB MAC sub-frame to which respective headers are added, the headers having respective pieces of padding bit information corresponding to the respective MSB sub-frame and LSB sub-frame.

7. The UEP transmission apparatus according to claim 2, wherein a UEP Tx controller is configured to negotiate the bit space depth and the bit separation position for each of the pixel components with a UEP reception apparatus by transmitting and receiving a UEP negotiation message including information about the pixel components, the bit space depths, and the bit separation positions.

8. The UEP transmission apparatus according to claim 1, wherein the pixel components constituting the pixels are divided into red, green, and blue components when the video data are represented by RGB colors and are divided into Y (a luminance component) and Cb and Cr (chrominance components) when the video data are represented by YCbCr colors.

9. A UEP transmission method, comprising:
creating a channel-encoded MSB data and a channel-encoded LSB data by performing error correction encodings respectively corresponding to a MSB MAC sub-frame and an LSB MAC sub-frame, the MSB MAC sub-frame and the LSB MAC sub-frame being separately created based on a degree of importance on a pixel-component basis of video data; and
modulating the channel-encoded MSB data and the channel-encoded LSB data by mapping the channel-encoded MSB data and the channel-encoded LSB data to a predetermined number of symbols based on the degree of importance,
wherein the performing of the mapping comprises performing the symbol mappings to enable the channel-encoded MSB data to have a greater Euclidean distance than the channel-encoded LSB data.

10. The UEP transmission method according to claim 9, wherein the creating comprises performing the error correction encodings to enable the MSB MAC sub-frame to be stronger, against an error, than the LSB MAC sub-frame.

11. The UEP transmission method according to claim 9, wherein the creating comprises adding padding bits, corresponding to the respective channel-encoded MSB data and channel-encoded LSB data, to the channel-encoded MSB data and channel-encoded LSB data.

12. The UEP transmission method according to claim 9, wherein the modulating comprises:
multiplexing the channel-encoded MSB data and the channel-encoded LSB data to output bit streams;
performing symbol mappings for bit streams with a distorted constellation; and
modulating the mapped symbols to generate UEP video data.

13. The UEP transmission apparatus according to claim 12, wherein the UEP video data comprises information about a priority indicating a degree of importance of the UEP video data, a sequence number indicating a transmission sequence, an MCS index indicating a method of modulating and channel-encoding the video data, the pixel component, and the bit space depth.

14. The UEP transmission apparatus according to claim 12, further comprising:
checking, when the video data are received, a bit space depth and a bit separation position indicating a degree of importance for each of the pixel components constituting a pixel;
separating pixels of the video data into MSBs having a high degree of importance and LSBs having a low degree of importance according to a degree of importance on a pixel-component basis;
creating the MSB sub-frame and the LSB sub-frame based on the respective MSBs and LSBs; and
creating the MSB MAC sub-frame and the LSB MAC sub-frame to which respective headers are added, the headers having respective pieces of padding bit information corresponding to the respective MSB sub-frame and LSB sub-frame,
wherein the checking comprises negotiating the bit space depth and the bit separation position for each of the pixel components with a UEP reception apparatus by transmitting and receiving a UEP negotiation message including information about the pixel components, the bit space depths, and the bit separation positions.

15. The UEP transmission apparatus according to claim 9, wherein the pixel components constituting the pixels are divided into red, green, and blue components when the video data are represented by RGB colors and are divided into Y (a luminance component) and Cb and Cr (chrominance components) when the video data are represented by YCbCr colors.

* * * * *